(12) United States Patent
Chinnah et al.

(10) Patent No.: US 9,955,819 B2
(45) Date of Patent: May 1, 2018

(54) COOKER WITH THERMOELECTRIC GENERATION

(71) Applicant: Terraoak, Inc., Waverly, IA (US)

(72) Inventors: Maxwell K. Chinnah, Waverly, IA (US); Godwin Attigah, Hillside, NJ (US)

(73) Assignee: TERRAOAK, INC., Waverly, IA (US)

( * ) Notice: Subject to any disclaimer, the term of this patent is extended or adjusted under 35 U.S.C. 154(b) by 84 days.

(21) Appl. No.: 15/051,485

(22) Filed: Feb. 23, 2016

(65) Prior Publication Data

US 2017/0238762 A1 Aug. 24, 2017

(51) Int. Cl.
*A47J 37/07* (2006.01)
*F24C 1/16* (2006.01)
*H01L 35/30* (2006.01)
*F24C 1/00* (2006.01)
*H01L 35/28* (2006.01)

(52) U.S. Cl.
CPC ............. *A47J 37/0763* (2013.01); *F24C 1/16* (2013.01); *H01L 35/30* (2013.01)

(58) Field of Classification Search
CPC ..... A47J 37/7063; A47J 37/0763; F24C 1/16; F24C 1/00; H01L 35/30
USPC .............................. 126/25 R, 1 R; 220/573.1
IPC .............. A47J 37/07; F24C 1/16; H01L 35/28
See application file for complete search history.

(56) References Cited

U.S. PATENT DOCUMENTS

| | | |
|---|---|---|
| 3,279,452 A | 10/1966 | Hottenroth et al. |
| 3,915,144 A * | 10/1975 | Tomita ................ A47J 37/0763 126/25 B |
| 4,130,103 A | 12/1978 | Zimmerman |
| 5,033,956 A | 7/1991 | Nystrom |
| 5,404,864 A * | 4/1995 | Kent, Jr. ............. A47J 37/0763 126/25 B |
| 8,297,271 B2 | 10/2012 | Cedar et al. |
| 8,851,062 B2 | 10/2014 | Cedar et al. |
| 9,655,472 B1 * | 5/2017 | Alvarenga .......... A47J 37/0763 |
| 9,844,300 B2 * | 12/2017 | Cedar ................. A47J 37/0754 |
| 2006/0033674 A1 * | 2/2006 | Essig, Jr. ............... B01D 61/06 343/912 |

(Continued)

FOREIGN PATENT DOCUMENTS

| | | | |
|---|---|---|---|
| JP | 63073007 A | * | 4/1988 |
| JP | 09108096 A | * | 4/1997 |

OTHER PUBLICATIONS

International Search Report and Written Opinion, PCT International Application No. PCT/US2017/019144.

*Primary Examiner* — Gregory Huson
*Assistant Examiner* — Daniel E Namay
(74) *Attorney, Agent, or Firm* — Orrick, Herrington, Sutcliffe, LLP (57) ABSTRACT

A combustion cooker with an integrated and optionally removable thermoelectric generator and methods for making and using the same. The combustion cooker can include a fire basket that comprises a bottom region and a lateral region that is coupled with the bottom region and that defines a central combustion chamber. Being disposed about a periphery of the fire basket, the thermoelectric generator can include a cold side heat sink and a hot side heat sink. The cold side heat sink can be cooled via exterior air available outside the housing; whereas, the hot side heat sink can be in direct thermal communication with the periphery of the fire basket. Thereby, the thermoelectric generator advantageously can generate electrical power based upon a thermal differential between the cold side heat sink and the hot side heat sink.

19 Claims, 8 Drawing Sheets

(56) References Cited

U.S. PATENT DOCUMENTS

| | | | |
|---|---|---|---|
| 2007/0210063 A1* | 9/2007 | Conrad | A47J 37/067 219/449.1 |
| 2008/0245352 A1* | 10/2008 | Solecki | F24B 1/02 126/58 |
| 2009/0025703 A1* | 1/2009 | Van Der Sluis | F24B 1/202 126/1 R |
| 2009/0123885 A1* | 5/2009 | Vestin | F23C 13/02 431/208 |
| 2010/0083946 A1 | 4/2010 | Cedar et al. | |
| 2011/0236549 A1* | 9/2011 | Bedard | A47J 27/04 426/523 |
| 2012/0060819 A1* | 3/2012 | Hunt | A47J 36/2477 126/1 R |
| 2013/0019850 A1* | 1/2013 | Zillmer | F24B 1/195 126/117 |
| 2013/0112187 A1* | 5/2013 | Cedar | F24B 1/182 126/15 A |
| 2014/0116410 A1* | 5/2014 | Sorrell | H01L 35/30 126/110 R |
| 2014/0178548 A1* | 6/2014 | Drummond | A47J 33/00 426/478 |
| 2015/0000648 A1* | 1/2015 | Jung | F24C 5/18 126/46 |
| 2015/0182046 A1* | 7/2015 | Walsh | A47G 19/2227 206/459.5 |
| 2015/0201805 A1 | 7/2015 | Cedar et al. | |
| 2015/0243870 A1* | 8/2015 | Kushch | H01L 35/30 136/211 |
| 2015/0380626 A1* | 12/2015 | Van Lingen | F23D 3/20 136/212 |
| 2016/0076774 A1* | 3/2016 | DeFoort | F24B 1/028 110/345 |
| 2016/0315241 A1* | 10/2016 | Parrish | H01L 35/30 |
| 2016/0334109 A1* | 11/2016 | Krohn | F23D 14/04 |
| 2017/0231426 A1* | 8/2017 | Barford | A47J 37/0754 126/30 |

\* cited by examiner

COOKER WITH THERMOELECTRIC GENERATION

CROSS REFERENCE TO RELATED APPLICATIONS

N/A

BACKGROUND

Portable combustion cookers and heaters are well known and widely used, particularly in developing countries as a primary means of food preparation and by campers and others who lack more elaborate cooking facilities. These devices operate to burn a hydrocarbon-based fuel source and direct the resultant heat onto a cooking vessel. The most versatile cookers are those that are capable of burning a variety of biomass fuels which are often more readily available than petroleum-based fuel sources such as liquefied or gaseous petroleum products such as kerosene, methane, natural gas, heating oil, and the like. Many portable combustion cookers are inefficient and highly polluting. Inefficient combustion results in the production of high levels of soot, smoke, and other airborne particulates and pollutants, and inefficient heating of the cooking vessel causing a concomitant increase in fuel consumption.

Access to electricity in camping and emergency situations, and in developing countries, is often sporadic, unreliable, or entirely unavailable. Accordingly, combustion cookers have been designed that convert a portion of the combustion heat into electricity using a thermoelectric generator ("TEG"). See, for example, U.S. Pat. No. 8,297,271, U.S. Pat. No. 8,861,062, and U.S. 2015/0201805. A heat sink element (e.g., a metal or other thermal conductor) transfers heat from the combustion chamber to the TEG for electricity production. However, there is a need to provide combination cooker/generator devices that are portable, inexpensive to produce, energy efficient, and environmentally friendly, while retaining the versatility of mixed biomass fuel cooker.

SUMMARY OF THE INVENTION

The invention provides a combustion device and, more specifically, a cooker configured to burn a hydrocarbon-based fuel (e.g., biomass and liquid petroleum products). Generally, the combustion device is defined by an outer housing having a first opening, an inner housing having a second opening and disposed within the outer housing, wherein the space between the inner housing and outer housing defines an air gap, a fire basket comprising perforations and defining a combustion chamber disposed within the inner housing, and a thermoelectric generator disposed within the first opening and the second opening and comprising a hot side heat sink, a cold side heat sink, an electricity output interface, an air flow path defined by an intake port open to exterior of the combustion device and an exhaust port open to the air gap, wherein the air flow path is in communication with the cold side heat sink, and an electric fan powered by the thermoelectric generator and adapted to draw air through the air flow path.

In some embodiments, the hot side heat sink is disposed within the inner housing, is thermally coupled to the fire basket, or is disposed within the fire basket.

In some embodiments, the inner housing further comprises perforations. Optionally, the perforations are contained within the lower half of the inner housing, preferably at a level below the bottom of the fire basket.

In some embodiments, the fire basket has perforations that define at least 25%, 50%, 75% or more of the surface area of the fire basket. Optionally, the fire basket is formed from a wire mesh. The fire basket may have one, two, three, or more layers (e.g., of wire mesh). Optionally, a catalytic material is incorporated into the fire basket. The catalytic material may be provided as a coating on at least one layer of the fire basket or it may be provided as a discrete layer, such as a discrete mesh layer.

In some embodiments, the outer housing may be open at the bottom or have a solid or discontinuous bottom. Optionally, the outer housing has perforations (e.g., in a solid bottom or lateral sides). Preferably, the perforations, if present, are located in the lower 25% or lower 50% of the outer housing body. Optionally, the outer housing also contains reversible closures for the perforations such that an operator can regulate the air flow through the perforations when the combustion device is in use.

In other embodiments, the combustion device also contains a ash collection container positioned below the fire basket. Optionally, the outer housing also has an opening, a door, or another reversal closure, aligned with an opening in the inner housing which together are adapted to allow for the placement and removal of the ash container within the combustion device.

Other features and embodiments of the combustion device are set forth in the following description.

As used herein, "perforations" refers to holes or voids in an otherwise solid surface. It is understood that that the perforated surface may contain one or a plurality of holes. In some embodiments the perforations comprise less than 50% of the area of the surface. In other embodiments, perforated surfaces can be formed from a mesh (e.g., a wire mesh), wherein the term "mesh" generally refers to surfaces in which the perforations comprise more than 50% of the area of the surface.

As used herein, "biomass" or "biomass fuel source" means any carbonaceous material suitable for combustion. Biomass that may be used as fuel in the cooker devices of the invention include, but are not limited to, wood, paper, cardboard, coal, oil, and other petroleum products.

Figure 1:
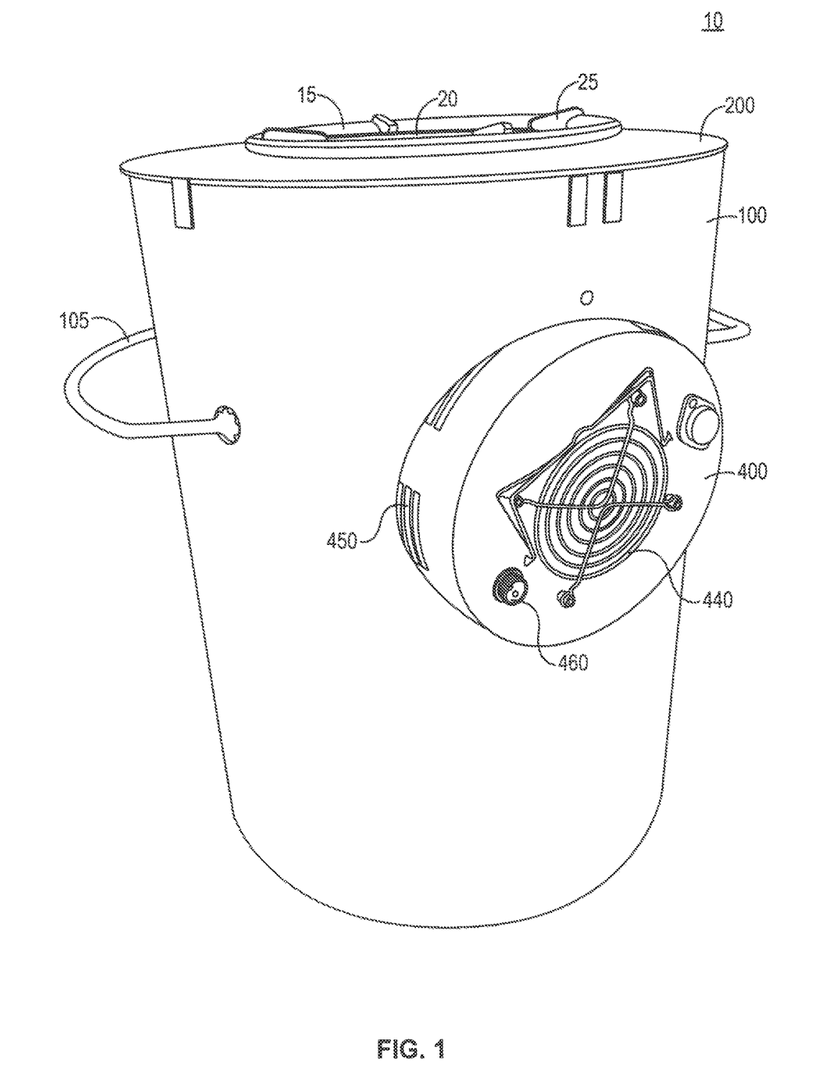
FIG. 1 is a perspective view of an assembled cooker 10 according to the principles and features described herein.

As used herein, terms such as "top", "bottom", "up", "down", and the like refer to directions relative to a cooker 10 having the general configuration shown in FIG. 1, when the cooker 10 is standing in its intended upright position on a substantially horizontal surface.

DETAILED DESCRIPTION

The invention generally provides a biomass-fired combustion cooker with an integrated thermoelectric generator (TEG) and components for use therein. In one embodiment, the body of the cooker consists of at least three distinct housing components: an outermost outer housing, an intermediately-disposed inner housing, and an inner fire basket. The TEG is supported by the outer housing and the hot side heat sink (hot side material) is disposed within the cooker body. Optionally, the fire basket comprises a catalytic material.

FIG. 1 is a perspective view of a fully assembled cooker 10 constructed in accordance with one embodiment of the invention. The cooker 10 is defined by an outer housing 100, and inner housing 200, and a TEG 400. Optionally, the outer housing 100 contains a handle 105 to aid in moving or carrying the cooker 10. The handle 105 may be fixed and rigid as illustrated, attached to the outer housing 100 by way of a hinge mechanism such that the handle 105 is movable, or removably attached. The specific design of the handle 105 is not limiting and is intended solely for the purpose of moving or carrying the cooker 10. Although depicted in FIG. 1 as having only a single handle 105, it is understood that the outer housing 100 of the cooker 10 may have two, three, four, or more handles, as necessary and desirable, based on the specific design of the cooker 10 handle 105.

Optionally, the cooker 10 also has a cooking ring 15 that circumnavigates the opening 20 to the combustion chamber. The cooking ring 15 may be integral or attached to the top surface of the cooker 10 (illustrated as the top surface of the inner housing) or it may be provided as a separate component that is positioned around the opening 20. The cooking ring 15 is configured to suspend a cooking vessel above the opening 20 for efficient heating and allow for the venting of combustion gases and heat produced in the combustion chamber. In one embodiment, the cooking ring 15 has one, two, three, four or more tabs 25 that extend into the opening and, optionally, contact the inner surface of the combustion chamber. The tabs 25 are intended to prevent the cooking ring 15 from sliding across the top surface of the cooker 10. The following description further exemplifies the structure and features of the cooker 10 and its components.

Outer Housing

The outer housing 100 forms the outermost shell of the cooker 10. The outer housing 100 provides structural support for other externally-mounted and integral components as described herein and, in combination with the air gap 130 and inner housing 200, serves as a heat shield. Under normal operating conditions, the lateral sides of the outer housing 100 remain relatively cool, thereby minimizing the chance that a user will accidentally burn themselves or that the cooker will ignite flammable materials that are nearby or in contact with the cooker 10.

Figure 2:
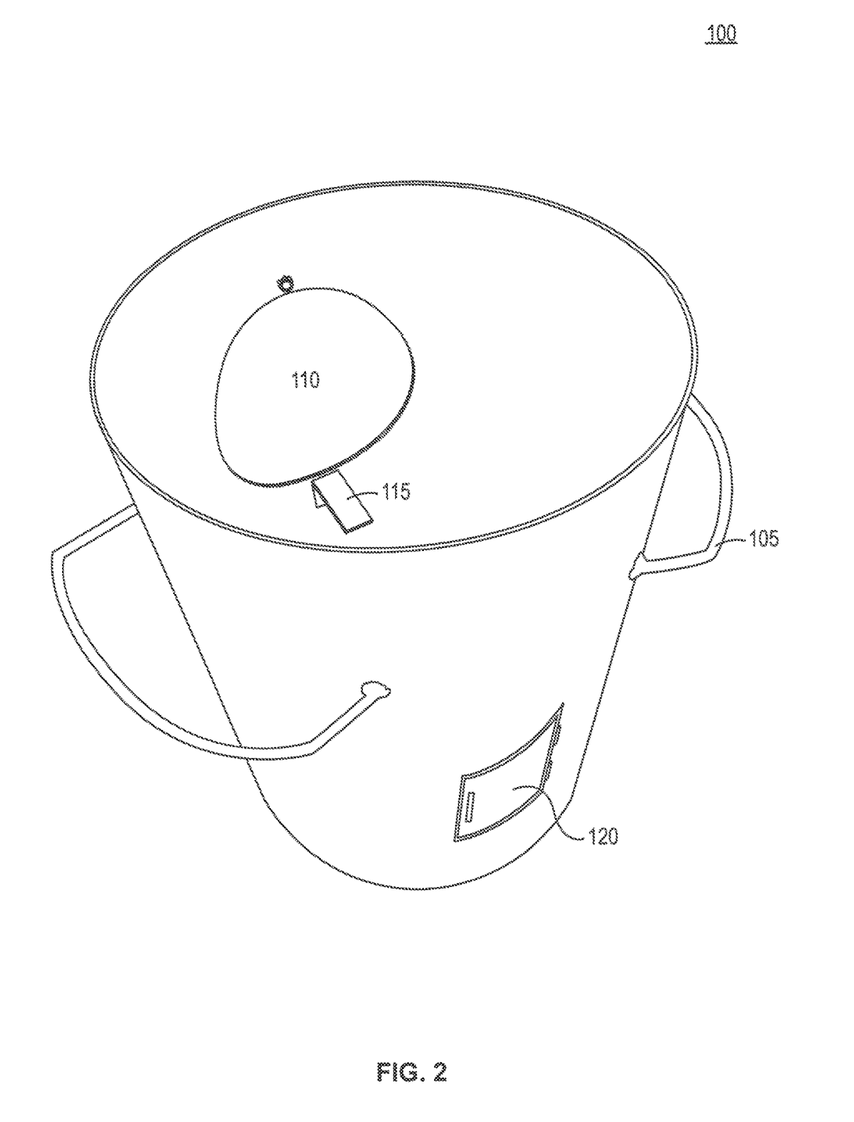
FIG. 2 is a perspective view of an outer housing 100.

As illustrated in FIG. 1, a handle 105 is optionally attached to the outer housing 100. The outer housing 100 contains an opening 110 configured to accommodate a TEG 400. Although opening 110 is illustrated as having a round shape, it is understood that the opening 110 preferably is configured to match the shape of the TEG 400, whatever that shape may be. The opening 110 should be no larger than necessary to accommodate the TEG 400 in order to minimize combustion heat loss. Optionally, the outer housing 100 also contains a TEG support 115 which is designed to provide structural stability to the various components when the TEG 400 is installed in the cooker 10. As illustrated in FIG. 2, the TEG support 115 may be a tab positioned below the opening 110 on which the TEG 400 rests.

In one embodiment, the outer housing 100 has a reversible closure for opening 110. The reversible closure may be a door, such as a hinged door affixed to the outer housing, or a removable panel and engaging mechanisms (e.g., slots and tabs) that effectively covers opening 110. The ability to seal opening 110 allows the cooker 10 to be used without a TEG 400 without excessive heat loss through opening 110 or air flow into the air gap 130. Optionally, the reversible closure also contains perforations, optionally with a further reversible closure, to allow the user to control air flow into air gap 130.

In another embodiment, the cooker 10 has an electric fan (i.e., instead of a TEG 400) positioned and mounted within opening 110. As described in more detail below, the fan may be used to create a positive pressure within air gap 130 by blowing ambient air into the cooker 10. This air is forced through the perforations 230 and improves the efficiency of combustion. The fan may be powered by any suitable means including, for example, a battery, a solar panel, or power from an electrical grid.

Optionally, the outer housing also contains a door 120. As described in more detail below, the door 120 is positioned at a level below the bottom of the fire basket 300 and is designed to provide access to an ash collection container 510. Optionally, the outer housing 100 also contains a plurality (three, four, five, six, or more) legs (not illustrated) designed to support the outer housing 100 above the ground.

The outer housing 100 may be open at the bottom or it may contain a continuous or discontinuous (e.g., perforated) bottom surface member. An outer housing 100 that is open at the bottom or contains a discontinuous bottom surface member is useful for improving air flow into the combustion chamber. These embodiments are particularly useful in conjunction with legs that raise the bottom of the cooker 10 above the ground. A continuous and solid bottom surface member is useful when it is desired that all ashes and combustion material be retained within the cooker.

In one embodiment, the outer housing 100 contains perforations that allow airflow into the air gap 130 between the outer housing and inner housing. Preferably, the perforations are formed in the lower half of the outer housing 100. In one embodiment, the perforations in the outer housing 100 align with perforations 230 in the inner housing 200, as described in more detail below. Optionally, the perforations in the outer housing 100 have a reversible closure so that the user can regulate the air flow into the cooker 10 in order to promote clean burning of the biomass.

The outer housing 100 may have any convenient three-dimensional shape. Although FIG. 1 illustrates a cylindrical outer housing 100, this shape is not intended to be limiting. Other shapes are possible including squares and rectangles.

Inner Housing

Figure 3:
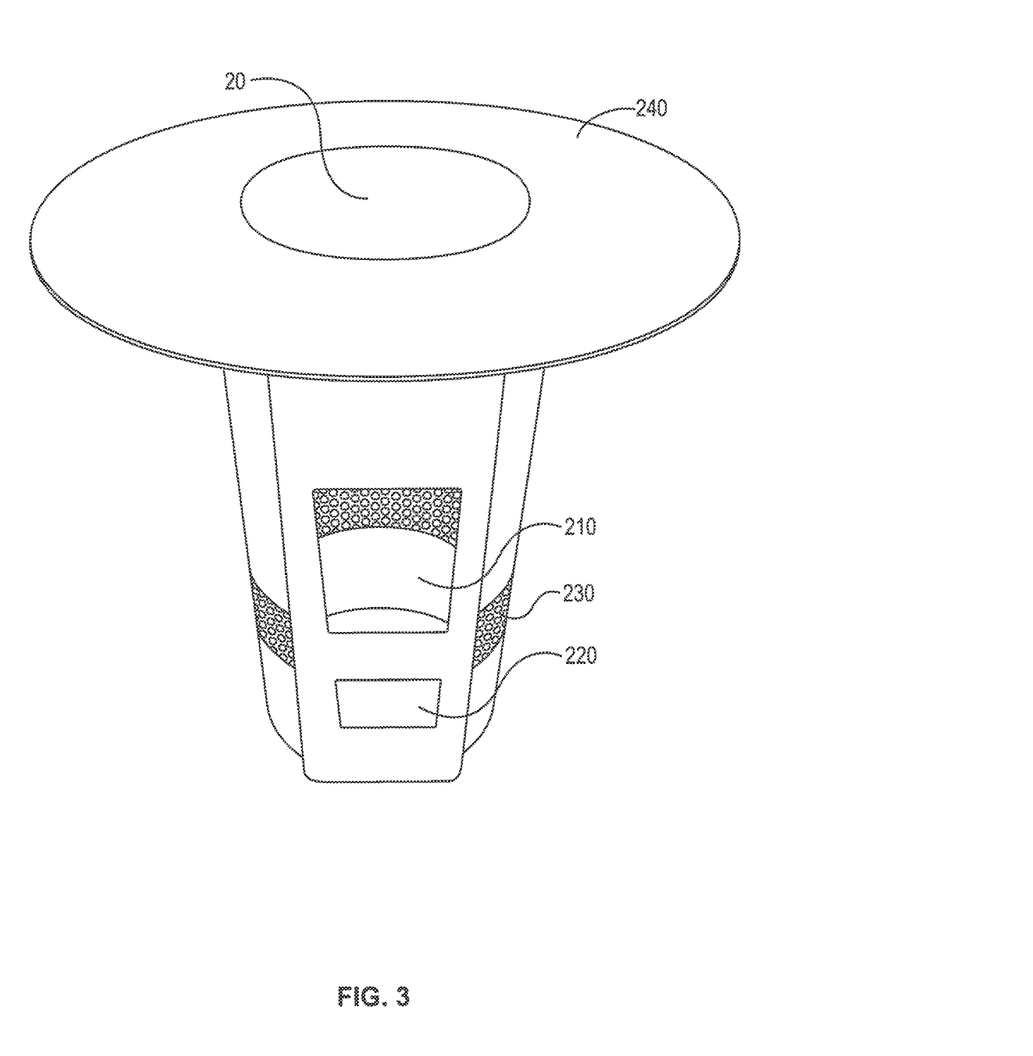
FIG. 3 is a perspective view of an inner housing 200.

The body inner housing 200 is configured to fit within the outer housing 100 and provide an air gap 130 between the inner housing 200 and the outer housing 100. In some embodiments, the air gap 130 is about 1, 2, 3, 4, 5, 6, 7, 8, 9, 10, or inches wide. Preferably, the inner housing 200 has the same general shape as the outer housing 100. As illustrated in FIGS. 2 and 3, the inner housing 200 and outer housing 100 have a generally round shape. The shape is not critical and these components may be differently-shaped but still function in accordance with the principles of the invention. Furthermore, there is no need for the inner housing 200 and outer housing 100 to have the same general shape, although it is preferred. For example, the outer housing 100 may be square or rectangular and the inner housing 200 may be round.

The inner housing 200 contains an opening 210 configured to accommodate the TEG 400 and align with opening 110 in the outer housing 100. The size and shape of opening 210 may be the same as the size and/or shape of opening 110, or it may be different. In one embodiment, opening 210 is the same shape as the outer surface of the TEG 400 and is only slightly larger than the outer dimension of the TEG 400 such that the TEG 400 rests on the inner surface defining the opening 210 for structural/mechanical support. Alternatively, opening 210 may be larger and/or differently shaped compared to opening 110 in order to facilitate easy mounting and dismounting of a removable TEG 400.

Optionally, the outer housing 100 and the inner housing 200 have an alignment mechanism to assist in aligning opening 110 and 210. An alignment mechanism may be, for example, a tab-and-channel system in which the inner wall of the outer housing 100 contains one alignment member that may be reversibly engaged with the other alignment member on the outer wall of the inner housing 200.

Optionally, the inner housing 200 also has opening 220 which aligns with door 120 to provide access to an ash collection container 510.

Optionally, the inner housing 200 also contains perforations 230. The purpose of the perforations 230 is to facilitate airflow from the air gap 130 between the inner housing 200 and the outer housing 100 into the combustion chamber defined by the fire basket 300. There is no limitation on the size, amount, or location of the perforations 230. However, in order to promote efficient combustion, it is preferred that at least the upper 50% of the inner housing 200 is substantially solid. In another embodiment, the perforations 230 are located below the bottom of the fire basket 300, when the fire basket 300 is positioned within the inner housing 200. The solid (unperforated) upper portion of the inner housing 200 functions as a chimney for the heat and combustion gases produced in the combustion chamber. Optionally, the perforations 230 are present adjacent to the lower eighth, quarter, or half of the fire basket 300. The perforations 230 may extend completely or partially around the body of the inner housing 200.

In one embodiment, opening 220 is positioned below the lowest level of the perforations 230, as illustrated in FIG. 3. Alternatively, opening 220 may be present within a perforated region.

Inner housing 200 is illustrated as having cooker top 240 as an integral member. In this configuration, inner housing 200 is used with an outer housing 100 that is open at the top such that the cooker 10 is defined on the lateral surfaces by the outer housing 100 and top surface by the cooker top 240. Thus, the bottom side of the cooker top 240 rests on the top edges of the outer housing 100 when the cooker 10 is assembled. The inner housing 200 also may contain a support structure for the fire basket 300 which is placed therein. The support structure may be a solid bottom, preferably having perforation, capable of supporting the weight of the fire basket 300 and biomass fuel. Alternatively, the support structure may be one or more engagement mechanisms disposed about the interior surface and designed to interact with the fire basket 300 and provide suspension. Alternatively, the fire basket 300 may be self-supporting such as through an integral lip or rim that rests on top of the inner housing 200 and/or the outer housing 100.

It is understood that the foregoing configuration is not limiting. For example, the cooker top 240 may be provided as a separate element that is reversible engaged with the outer housing 100, the inner housing 200, or the fire basket 300. In this configuration, the cooker 10 may be assembled by placing the inner housing 200 within the outer housing 100 and securing the two components together using the cooker top 240. The fire basket 300 may be configured such that it can be inserted through the opening 20 when the other elements are assembled. Alternatively, the fire basket 300 may be placed within the inner housing prior to the addition of the cooker top. This latter configuration has the advantage that it can be adapted to secure the fire basket 300 within the cooker 10 such that the fire basket 300 remains contained within the cooker 10, even if the unit is knocked over.

In yet another configuration, the cooker top 300 may be contiguous with the fire basket 300 such that the inner housing 200 would be open at the top to accommodate the combined component.

The specific configuration of the cooker top 240 does not alter the cooker's function. The cooker top 240 should be configured to provide a stable surface surrounding opening 20 and capable of supporting cooking ring 25 and a cooking vessel. Preferably, the cooker top 240, in any configuration, provides a relatively tight seal between itself and the outer housing 100 and/or the inner housing 200 such that the combustion heat and gases are efficiently and substantially completely vented through opening 20.

Fire Basket

Figure 4:
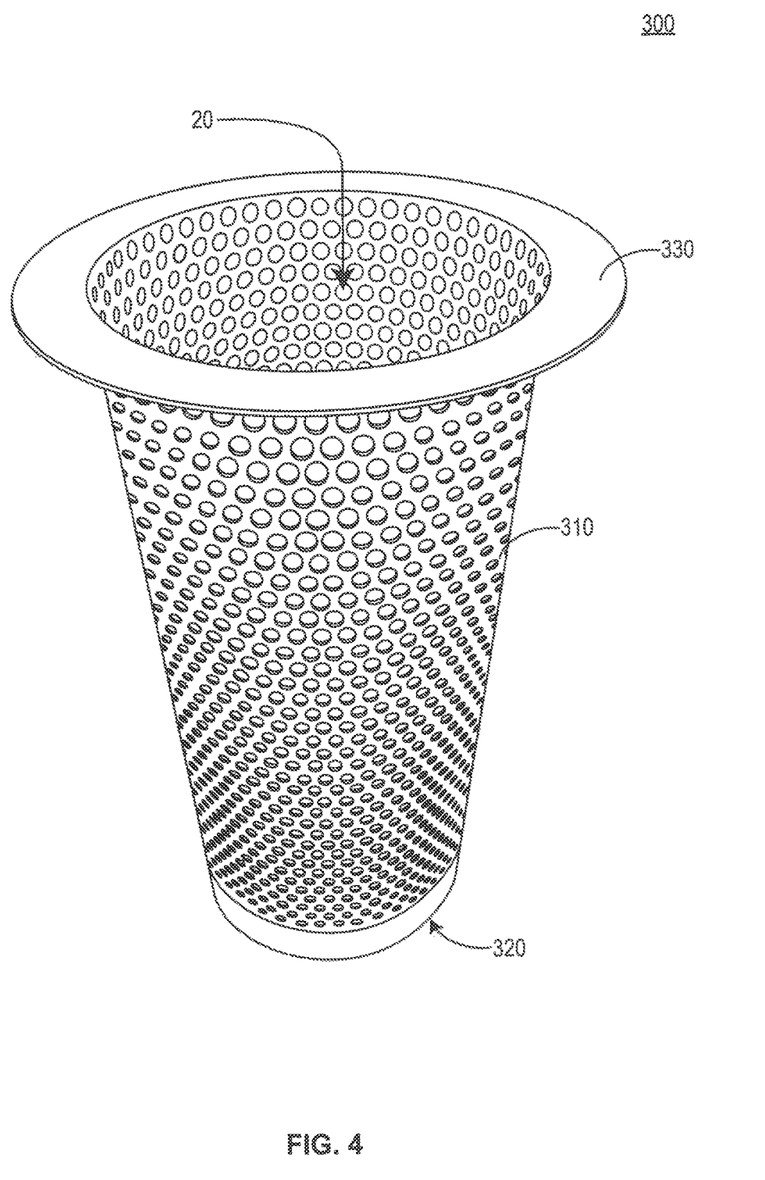
FIG. 4 is a perspective view of a fire basket 300.

As illustrated in FIG. 4, the fire basket 300 defines the combustion chamber. The fire basket 300 should be made of material that can withstand the heat of combustion without deforming and is preferably thermoconductive. Typically, the fire basket 300 is made of metal (e.g., steel). The fire basket 300 is configured to be open at the top to allow for loading of fresh biomass for combustion and for the removal of spent biomass fuel (e.g., ashes). The fire basket 300 also is configured to permit efficient and high volume air flow into the combustion chamber. In one embodiment illustrated in FIG. 4, the fire basket 300 is defined as having lateral sides 310 and a bottom 320. The lateral sides may be perforated over their entire height or may be perforated only over the bottom quarter, half, or three quarters of their height. The bottom 320 may be solid or perforated and is adapted to support the weight of the biomass fuel to be contained therein.

In one embodiment, the fire basket 300 is composed of a mesh in which more than 25%, 50%, 75%, or more of the surface area is defined by the void space of the perforations 230.

In one embodiment, the lateral sides 310 of the fire basket 300 have an inner and an outer layer. Preferably, both layers are mesh.

In one embodiment, the fire basket 300 further contains a support mechanism for engaging the inner housing 200 and/or the outer housing 100. As illustrated in FIG. 4, the support mechanism may be a flange 330 configured to rest on the top of the or a support member within the inner housing 200.

Optionally, the opening 20 at the top of the fire basket 300 is adapted to accept the tabs 25 of the cooking ring 15 such that the cooking ring 15 is held securely in place.

In one embodiment, the fire basket 300 also contains a catalytic metal such as platinum, palladium, rhodium, and gold, to facilitate the oxidation of carbon monoxide and/or the reduction of nitrogen oxides produced during combustion of the biomass. The catalytic metal may be coated on an underlying metal (e.g., steel) substrate (e.g., by electroplating), or provided as a discrete element such as a mesh layer that defines the fire basket 300.

Assembled Cooker Body

Figure 5:
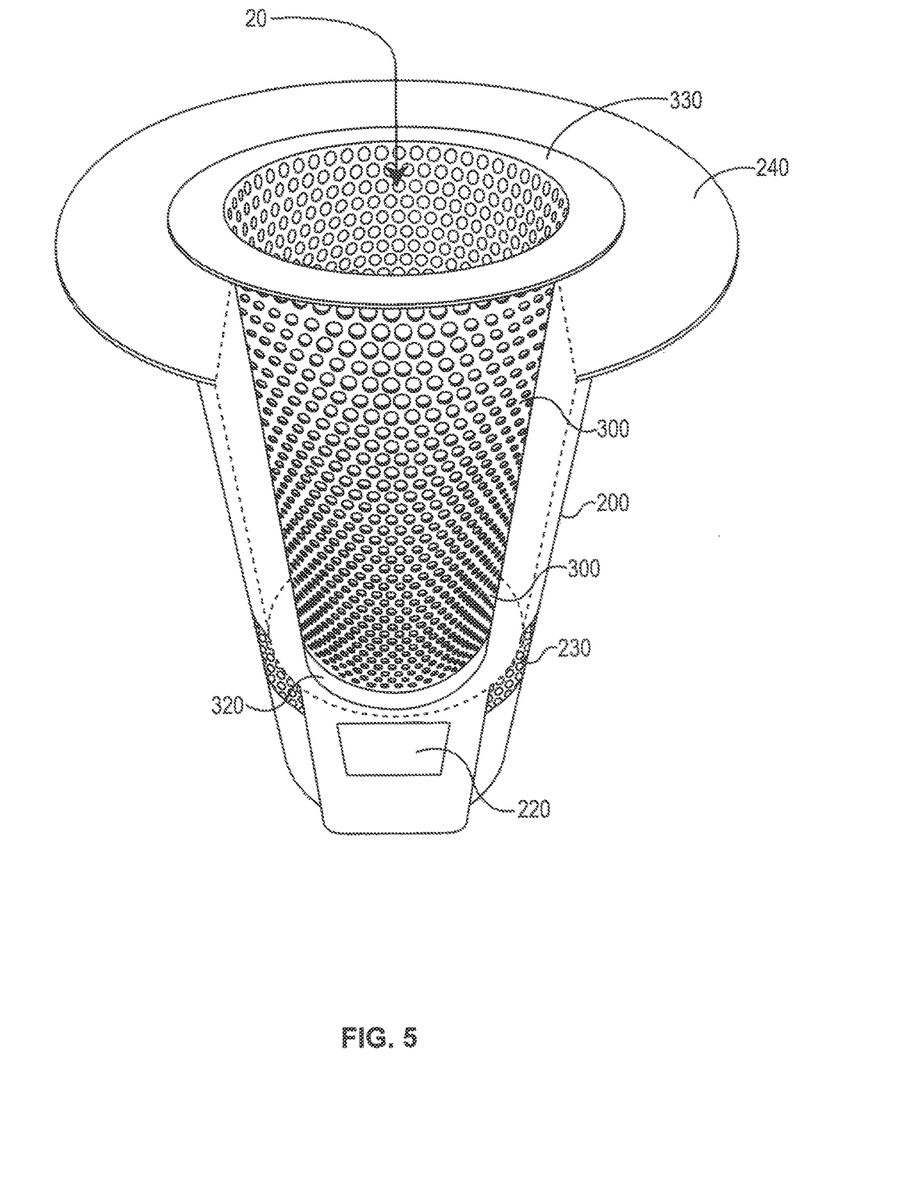
FIG. 5 is a cut-away view illustrating the assembly of a fire basket 300 and inner housing 200.
Figure 6:
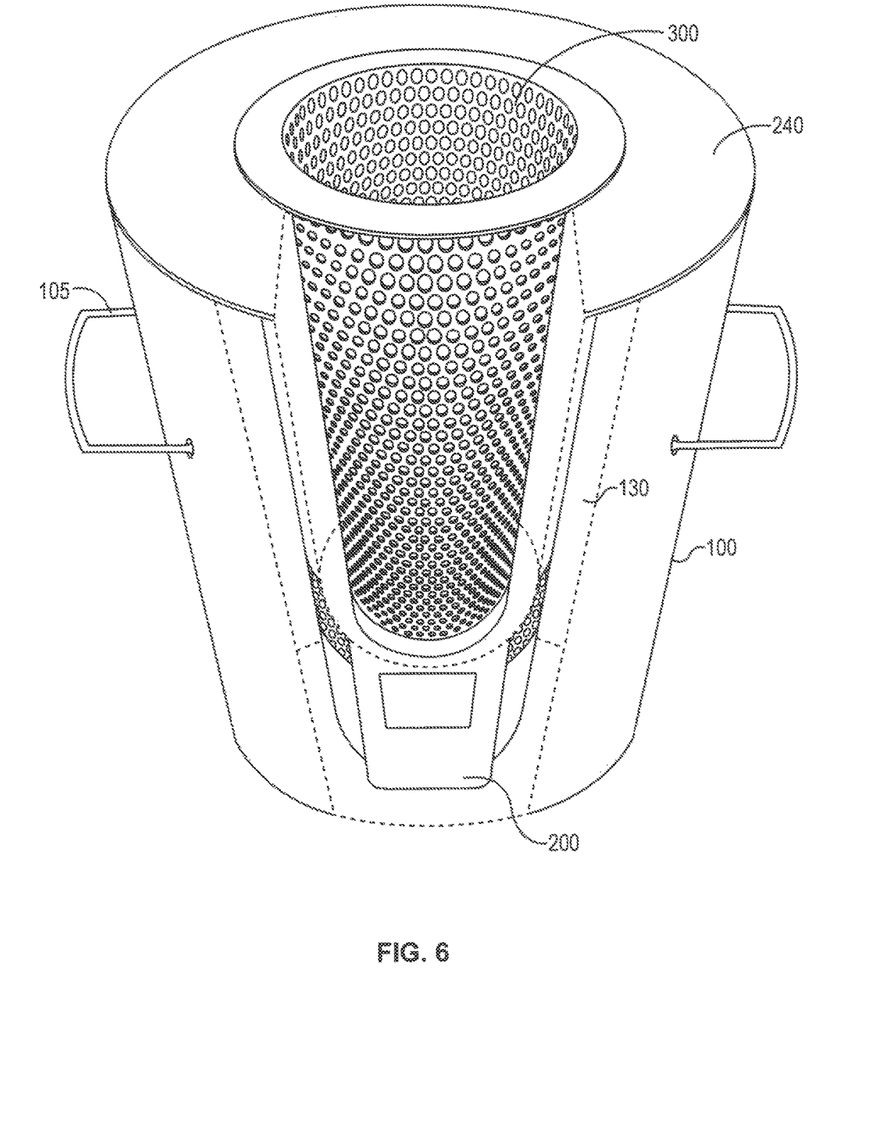
FIG. 6 is a cut-away view of an assembled cooker 10 illustrating the relative positioning of the various components described herein.
Figure 7:
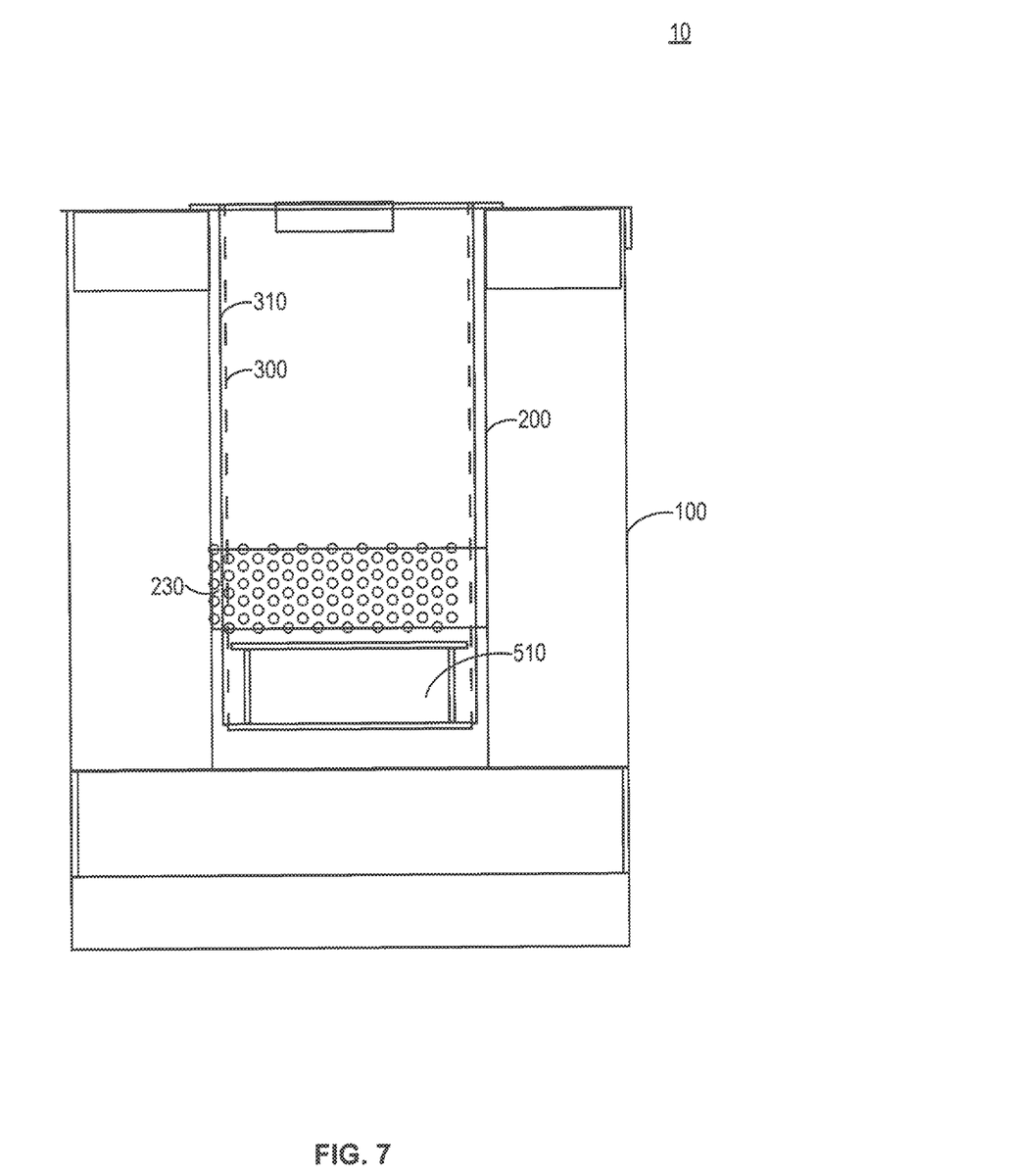
FIG. 7 is a schematic cross-sectional view of an assembled cooker 10.

FIGS. 5 and 6 illustrate various aspects of an assembled cooker body. FIG. 5 illustrates the engagement of the fire basket 300 with the inner housing 200. Specifically, fire basket 300 is positioned within the central space defined by the inner housing 200, and the flange 330 of the fire basket 300 rests on the cooker top 240 of the inner housing 200. As illustrated in this embodiment, inner housing 200 has perforations 230 only at a level below the bottom 320 of the fire basket 300. The flange 330 defined the inner boundary of the chimney portion of the combustion chamber/fire basket 300. A cooking ring 15 (not illustrated) is designed to engage with the flange 330 in order to support a cooking vessel and allow for the venting of combustion gases and heat produced within the fire basket 300. Opening 220 is positioned below the perforations 230. In the embodiment illustrated, the region above opening 220 is not perforated in order to provide additional structural rigidity to the inner housing 200. Thus, the perforations 230 do not fully circumnavigate the inner housing 200. It is understood that this is a routine design choice and that other configurations are possible. For example, opening 220 may be disposed relatively lower on the inner housing 200 such that the perforations 230 fully circumnavigate the inner housing 200.

FIG. 6 illustrates a cross-section through a fully assembled cooker 10. The fire basket 300 is placed within the central space defined by the inner housing 200, as illustrated in FIG. 5, and the inner housing 200 assembly with the fire basket 300 is placed within the central space defined by the outer housing 100. As described previously, the inner housing 200 has a significantly smaller outer dimension than the inner dimension of the outer housing 100 to create an air gap 130 between the two. In the illustrated embodiment, the cooker top 240 is integral to the inner housing 200 and rests on the top edge of the outer housing 100 such that the inner housing 200 is supported above the bottom of the outer housing 100. As described previously, the outer housing 100 may be open at the bottom or may have a solid/continuous bottom or a discontinuous bottom.

Ash Collection Container

In some embodiments and as illustrated in FIG. 6, the cooker further comprises an ash collection container 510 positioned below the fire basket 300. An ash collection container 510 is particularly useful with a fire basket 300 having perforations in the bottom surface. An ash collection container 510 is also useful in a cooker 10 in which the outer housing 100 is open at the bottom.

The ash collection container 510 is formed from any suitable material that can withstand the heat of combustion without becoming deformed or damaged. Suitable materials include metals, as described herein. The ash collection container 510 may have any shape and dimension appropriate for retaining the amount of ash expected to be produced based on the volume of the combustion chamber, intended duration of cooker use, and anticipated biomass fuel type.

In one embodiment, the ash collection container 510 is suspended on supports fixed to the inner surface of the inner housing 200 at a level that is below that of the bottom of the fire basket 300 when the fire basket 300 is installed. The ash collection container 510 may be accessed through the chimney portion of the inner housing 200 when the fire basket 300 is removed. Optionally and as illustrated in FIGS. 2 and 3, the ash collection 510 container may be accessed through a door or opening in the outer housing 100 that aligns with an opening in the inner housing 200. The advantage of this configuration is that there is no requirement for fire basket 300 removal and the ash collection container 510 may be removed and emptied while the cooker 10 is in use.

Thermoelectric Generator

Thermoelectric generators are known to the skilled artisan. TEGs operate on the Seeback effect and convert thermal energy into electricity. The core of the TEG is the thermoelectric module which consists of two different thermoelectric materials (heat carriers) that are electrically interconnected. A thermal gradient between the "hot side" and the "cold side" causes a direct current to flow in the electrical circuit as the heat is transferred through the heat carriers. The amount of electricity produced is proportional to the heat differential across the TEG (i.e., between the hot side and the cold side). Thus, electricity generation depends upon the efficient heating of the hot side and the efficient cooling of the cold side. Electricity produced in the circuit is directed to an output interface 460 (see, FIG. 1). The output interface may be any convention electrical socket or specialized electrical charging adapter such as a USB port.

Figure 8:
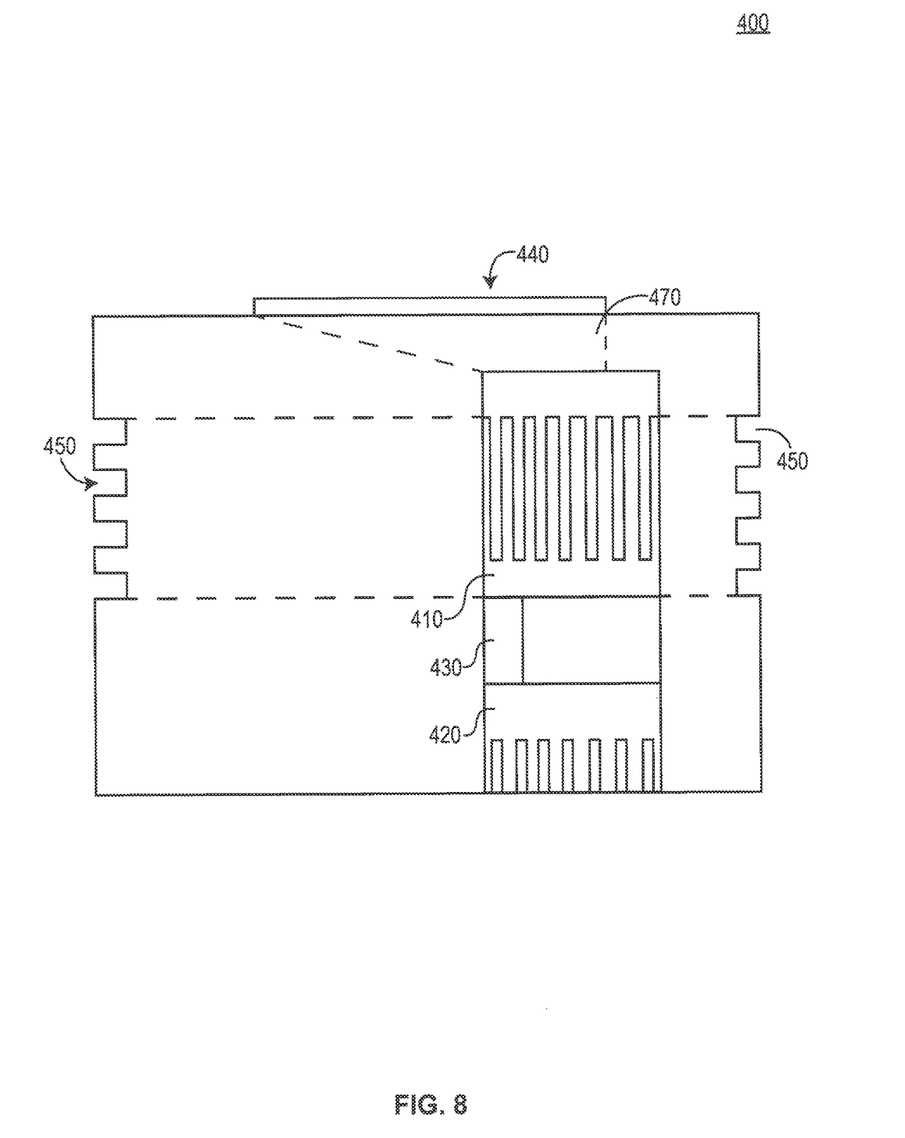
FIG. 8 is a schematic of a thermoelectric generator 400.

FIG. 8 is a TEG schematic illustrating the cold side heat sink 410, the hot side heat sink 420, and the intervening thermoelectric materials 430. One strategy for maintaining a high thermal gradient is to provide an air flow path across the cold side heat sink 410 in order to provide air cooling. In one embodiment, an electric fan 440 configured to draw or blow ambient (cold) air through an intake port 470 and across the cold side heat sink 410 to more efficiently dissipate heat, thereby maintaining a high thermal gradient. The warmed air is exhausted through one or more exhaust vents 450. In one embodiment, the electric fan 400 draws power from the TEG for operation (i.e., does not require an external power source).

Heat produced in the combustion chamber of the fire basket 300 may be transferred to the hot side 420 by any appropriate method. In one embodiment, the a thermally conductive probe is placed in thermal connection with the hot side heat sink 420 and extended into the combustion chamber. Thermally conductive probes may comprise a metal such as copper and steel. In this embodiment, the TEG may be disposed entirely outside of the outer housing 100 with only the probe penetrating the outer and/or inner housing. The probe may be in thermally conductive contact with the fire basket 300 or it may not contact the fire basket 300 but terminate within the interior of the inner housing 200. Optionally, the probe extends through an opening in the wall of the fire basket 300 and terminates within the combustion chamber.

In another embodiment, the TEG is positioned such that the hot side heat sink 420 is in direct thermal contact with the fire basket 300. The TEG may be permanently or removably coupled to the fire basket 300. Direct thermal contact includes placing the hot side heat sink 420 in direct physical contact with the fire basket 300 or providing a physical thermal connection (e.g., copper, steel, or other appropriate metal or thermal conductor) that physically contacts both the hot side heat sink 420 and the fire basket 300. This embodiment differs from an externally-mounted TEG and probe in that the hot side heat sink 420 is disposed within the outer dimension of the outer housing 100 and the thermal connection, if present, merely facilitates contact between the hot side heat sink 420 and the fire basket 300. For example, the thermal connection may be a non-perforated flattened region of the fire basket against which the hot side heat sink 420 rests. In this way, the fire basket 300 efficiently absorbs the heat of combustion by virtue of its large surface area (larger than the probe of the previous embodiment) and transfers that absorbed heat to the hot side heat sink 420. This configuration provides more efficient heat transfer than the previous embodiment utilizing a probe connected to an external TEG because of the larger surface area and mass of the fire basket 300. Additionally, electricity may be produced after all of the biomass fuel is consumed because the fire basket 300 will remain hotter than the air in the combustion chamber.

In another embodiment, the TEG is positioned with the hot side heat sink 420 positioned within the inner housing 200 but not in direct thermal contact with the fire basket. This configuration has the advantage of holding the hot side heat sink 420 in close proximity to the flame and fuel source and results in higher temperature gradients than the first embodiment involving a probe and externally-mounted TEG. Optionally, the hot side heat sink 420 is placed within the fire basket 300. In this embodiment, the fire basket 300 also has an opening that aligns with the opening 210 in the inner housing and the opening 110 in the outer housing such that the TEG penetrates all three structural elements, thereby positioning the hot side heat sink 420 within the fire basket 300.

In another embodiment that may be used in conjunction with any of the preceding TEG configurations, the union of the TEG and the outer housing is configured such that the exhaust vents 450 discharge some or all of the warmed air from the cold side heat sink 410 into the air gap 130 between the outer housing 100 and inner housing 200. The air vented into the air gap 130 therefore is forced through the perforations 230 in the inner housing 200 and into the combustion chamber defined by the fire basket 300. Relative to a configuration in which air is passively drawn into the combustion chamber, this configuration provides for a more efficient burn of the biomass fuel resulting in less soot and carbon monoxide production, and achieves higher combustion temperatures which improves cooking time and electricity generation. In this embodiment, it is preferable that the outer housing 100 further contain a solid bottom such that the fan 440 creates a positive air pressure within the air gap, thereby forcing substantially all of the exhausted air through the perforations 230 and into the fire basket 300.

Optionally, the TEG electricity generation circuit is functionally coupled to a rechargeable battery which may be integrated into the TEG or removably connected to the TEG through the output interface. The battery may be used to store electricity generated during cooker use that is not immediately consumed by a device electrically coupled to the output interface 450. Removable batteries either coupled to the output interface 450 or through another electrical coupling to the TEG circuit are preferred because it is often desirable to have an electricity source that is portable and/or available when the cooker is not in use.

In one embodiment, the fan 440 is a variable speed fan that may be controlled by the operator. Increasing the fan speed may increase the combustion temperature by forcing more air into air gap 130, thereby providing more oxygen to the combustion chamber.

What is claimed is:

1. A combustion device, comprising:
    a housing;
    a fire basket being disposed within said housing and comprising a bottom region and a lateral region being coupled with the bottom region and defining a central combustion chamber; and
    a thermoelectric generator being disposed about a periphery of said fire basket and comprising a cold side heat sink being cooled via exterior air available outside said housing and a hot side heat sink being in direct thermal communication with the periphery of said fire basket, wherein said thermoelectric generator generates electrical power based upon a thermal differential between the cold side heat sink and the hot side heat sink.

2. The combustion device of claim 1, wherein said thermoelectric generator comprises a plurality of thermoelectric generators for generating the electrical power, each of said thermoelectric generators being disposed at the periphery of said fire basket and comprising the cold side heat sink and the hot side heat sink.

3. The combustion device of claim 2, wherein the hot side heat sinks of said thermoelectric generators communicate with the central combustion chamber via respective openings formed in the periphery of said fire basket.

4. The combustion device of claim 3, wherein the periphery of said fire basket forms each of the openings with a shape that corresponds with a shape of the hot side heat sink of a relevant thermoelectric generator.

5. The combustion device of claim 1, wherein said thermoelectric generator extends between said housing and said fire basket.

6. The combustion device of claim 5, wherein the hot side heat sink of said thermoelectric generator does not extend into the central combustion chamber.

7. The combustion device of claim 6, wherein said fire basket is removably disposed within said housing.

8. The combustion device of claim 5, wherein said housing defines a vent opening for cooperating with the cold side heat sink of said thermoelectric generator.

9. The combustion device of claim 8, wherein said housing receives the exterior air for cooling the cold side heat sink of said thermoelectric generator via the vent opening.

10. The combustion device of claim 1, further comprising an electric fan for drawing the exterior air into said housing and onto the cold side heat sink of said thermoelectric generator.

11. The combustion device of claim 10, wherein said electric fan draws the exterior air from outside said housing into the combustion chamber.

12. The combustion device of claim 10, wherein said thermoelectric generator provides the electrical power for operating said electric fan.

13. The combustion device of claim 10, wherein said housing comprises an inner housing for receiving said fire basket and an outer housing being disposed about said inner housing and defining an air gap therebetween, said electric fan drawing the exterior air from outside said outer housing into the air gap for cooling the cold side heat sink of said thermoelectric generator.

14. The combustion device of claim 1, wherein said fire basket comprises a cooker top region being opposite the bottom region and defining a chimney opening in communication with the central combustion chamber.

15. The combustion device of claim 14, wherein the cooker top region is capable of supporting a cooking ring.

16. The combustion device of claim 15, wherein the cooking ring forms a central opening that communicates with the chimney opening defined by the cooker top region.

17. The combustion device of claim 14, wherein the cooker top region includes a support member extending from the lateral region, the support member for engaging said housing and supporting said fire basket.

18. The combustion device of claim 1, further comprising a power outlet for coupling with a peripheral device and providing the electrical power generated by said thermoelectric generator to the coupled peripheral device.

19. The combustion device of claim 18, said power outlet comprises one or more Universal Serial Bus connectors.

* * * * *